United States Patent
Molnar et al.

(10) Patent No.: US 7,460,844 B2
(45) Date of Patent: Dec. 2, 2008

(54) HIGH DYNAMIC RANGE TIME-VARYING INTEGRATED RECEIVER FOR ELIMINATION OF OFF-CHIP FILTERS

(75) Inventors: Alyosha Molnar, Berkeley, CA (US); Rahul Magoon, Irvine, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 481 days.

(21) Appl. No.: 11/046,023

(22) Filed: Jan. 28, 2005

(65) Prior Publication Data

US 2005/0164669 A1 Jul. 28, 2005

Related U.S. Application Data

(60) Provisional application No. 60/539,702, filed on Jan. 28, 2004.

(51) Int. Cl.
*H04B 1/26* (2006.01)
*H04B 1/28* (2006.01)

(52) U.S. Cl. .................. 455/130; 455/323; 455/333

(58) Field of Classification Search ............ 455/293, 455/330, 313–326, 333, 334–340
See application file for complete search history.

(56) References Cited

U.S. PATENT DOCUMENTS

| | | | |
|---|---|---|---|
| 5,060,298 | A | 10/1991 | Waugh et al. |
| 6,909,882 | B2 * | 6/2005 | Hayashi et al. ............ 455/84 |
| 6,999,747 | B2 * | 2/2006 | Su .......................... 455/324 |
| 7,092,692 | B2 * | 8/2006 | Tan et al. ................. 455/333 |
| 7,272,375 | B2 * | 9/2007 | Tuttle et al. .............. 455/333 |
| 2002/0042256 | A1 * | 4/2002 | Baldwin et al. .......... 455/232.1 |
| 2002/0173337 | A1 * | 11/2002 | Hajimiri et al. ............ 455/552 |
| 2003/0003952 | A1 * | 1/2003 | Kim ......................... 455/552 |
| 2003/0045263 | A1 * | 3/2003 | Wakayama et al. ......... 455/323 |
| 2003/0130006 | A1 * | 7/2003 | Reynolds .................. 455/550 |
| 2004/0081256 | A1 * | 4/2004 | Shi et al. ................... 375/317 |
| 2005/0064840 | A1 * | 3/2005 | Heydari et al. ............. 455/323 |
| 2005/0070325 | A1 * | 3/2005 | Bellaouar et al. ........ 455/550.1 |
| 2006/0068734 | A1 * | 3/2006 | Toyoda et al. ............ 455/234.1 |

FOREIGN PATENT DOCUMENTS

EP 94850153.1 9/1994

OTHER PUBLICATIONS

Itoh, et al., Even Harmonic Type Direct Conversion Receiver ICs for Mobile Handsets: Design Challenges and Solutions, 1999 IEEE Radio Frequency Integrated Circuits Symposium, Jul. 1999, pp. 53-56.

Matinpour, et al., A Low-Power Direct Conversion Receiver Module for C-Band Wireless Applications, 2001 IEEE Radio Frequency Integrated Circuits Symposium, Aug. 2001, pp. 263-266.

PCT International Search Report and Written Opinion of the International Searching Authority, mailed Jun. 9, 2005.

* cited by examiner

*Primary Examiner*—Simon D Nguyen
(74) *Attorney, Agent, or Firm*—Jackson Walker L.L.P.; Christopher J. Rourk

(57) ABSTRACT

A quadrature mixer with an LO input is provided. The quadrature mixer receives a signal having a frequency $F_{LO}$ and a signal input having a frequency $F_{SIG}$, and has an output that comprises an output impedance that is high at frequencies of $|F_{LO}-F_{SIG}|$ and $|F_{LO}+F_{SIG}|$ and low at other. A mixer coupled to the output impedance interacts with the output impedance such that an impedance presented at the signal input is high for signals at $F_{SIG}$ if $F_{SIG}$ is a predetermined signal frequency, and low at other frequencies.

21 Claims, 11 Drawing Sheets

300A

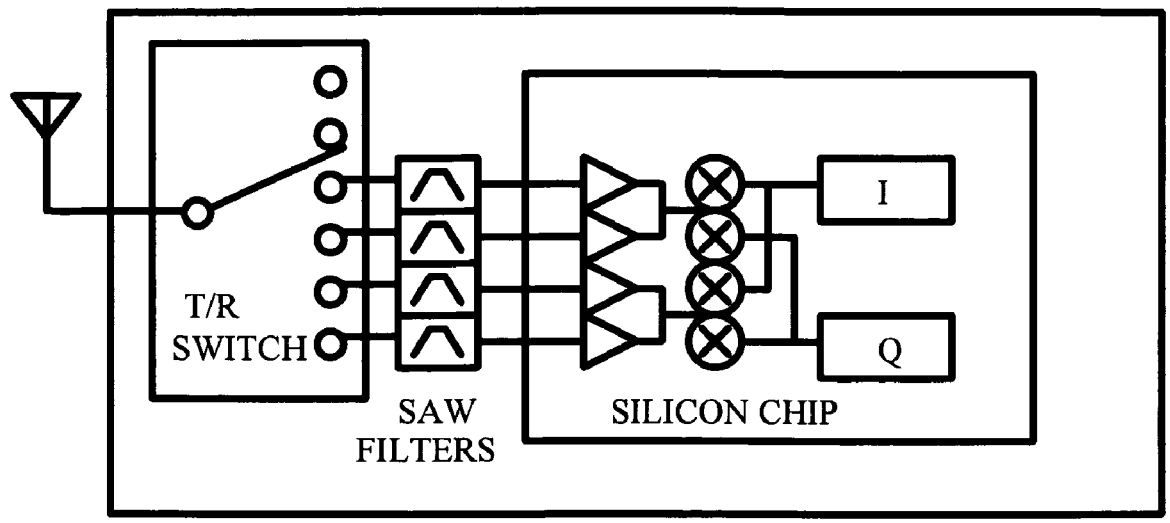
PRIOR ART
FIGURE 1    100 
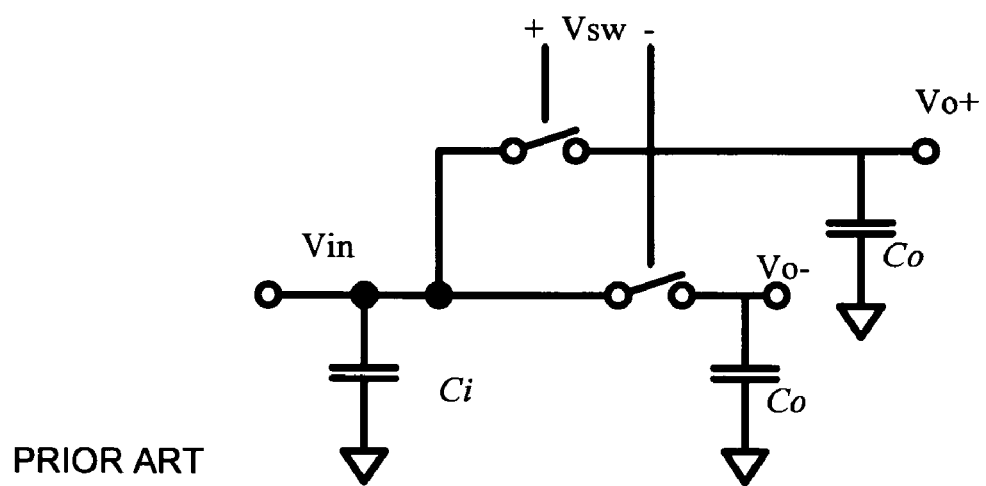
PRIOR ART
FIGURE 2    200 

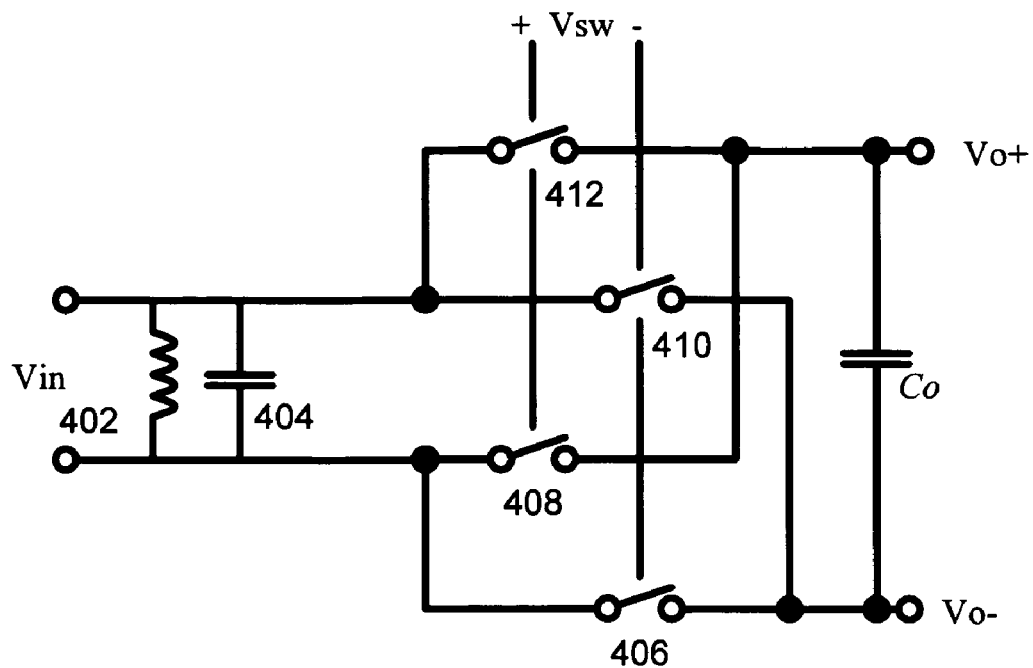
FIGURE 4     400
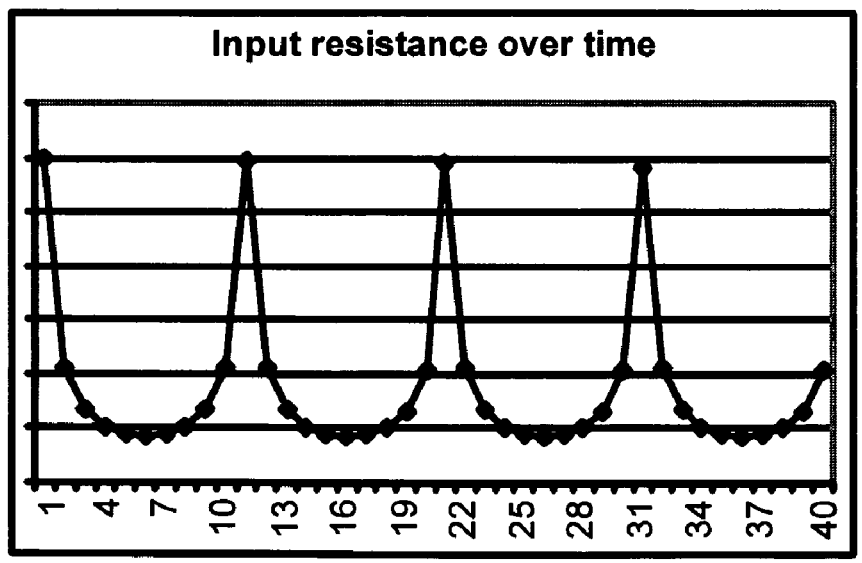
FIGURE 5A     500

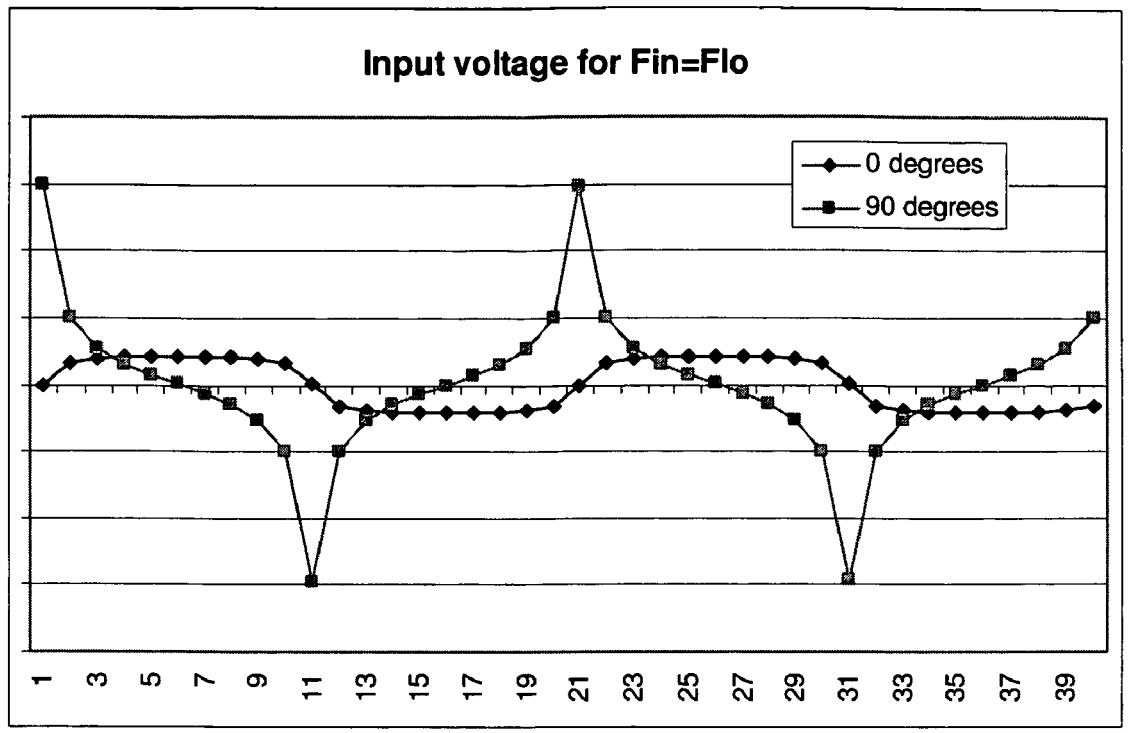

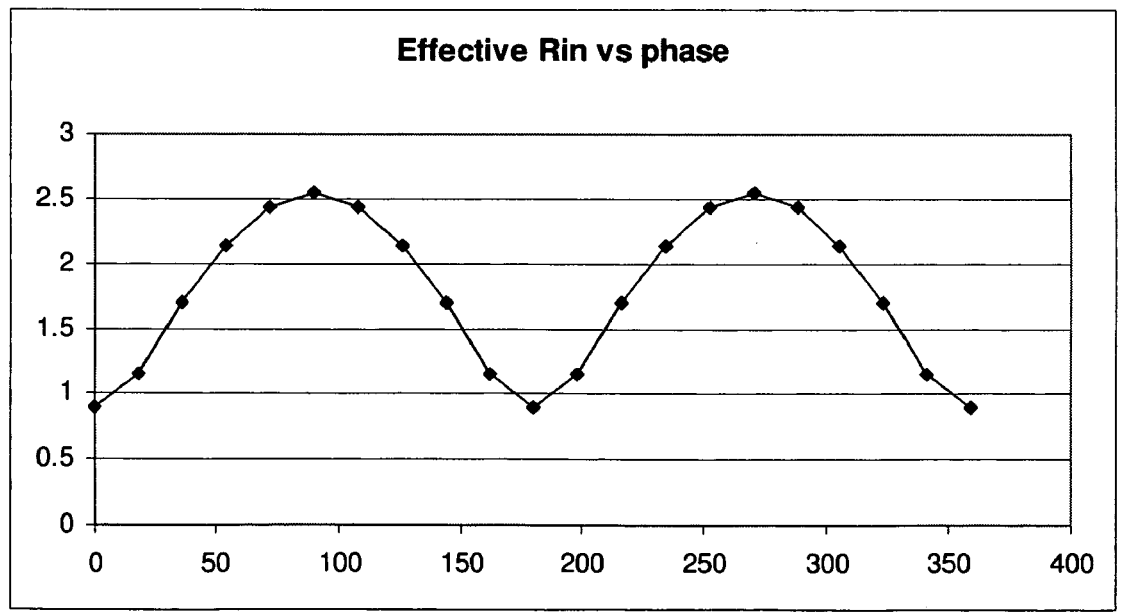

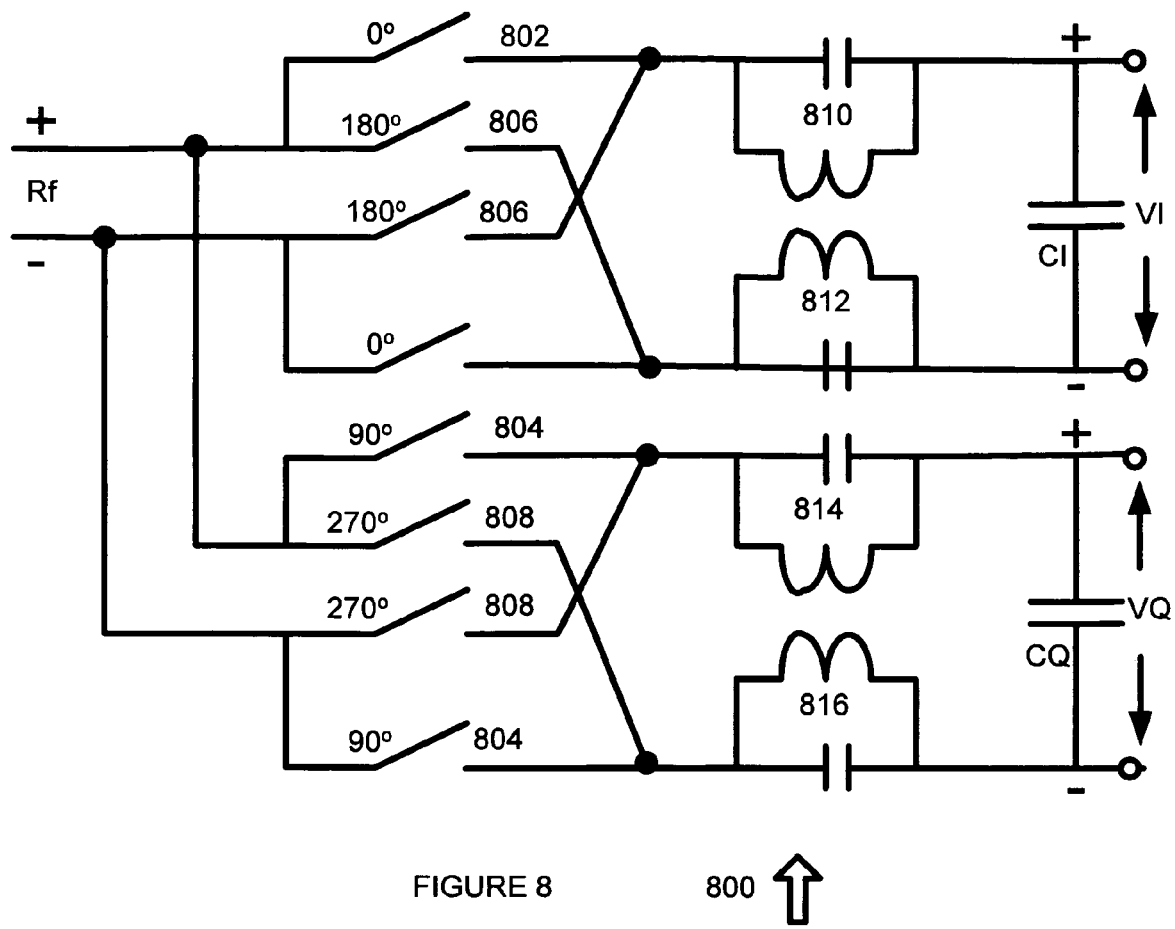
FIGURE 8     800

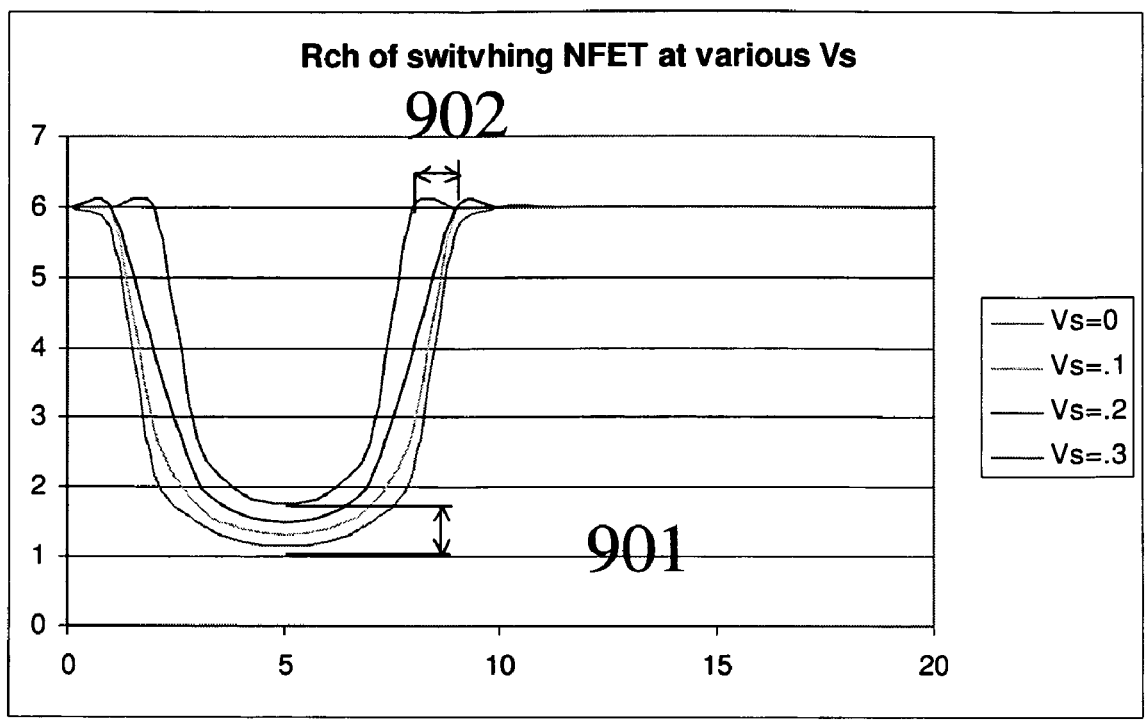
FIGURE 9        900 

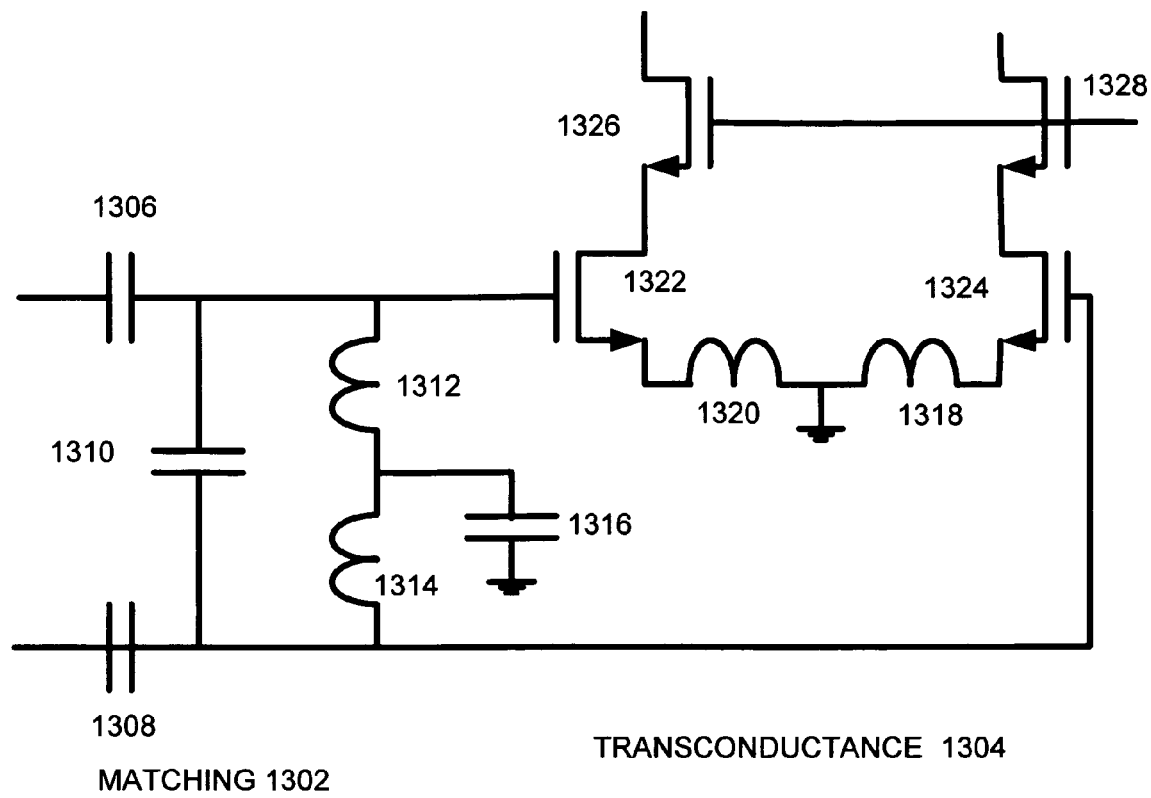
FIGURE 13          1300 ⬆

HIGH DYNAMIC RANGE TIME-VARYING INTEGRATED RECEIVER FOR ELIMINATION OF OFF-CHIP FILTERS

RELATED APPLICATIONS

This application claims priority to U.S. Provisional application 60/539,702, filed Jan. 28, 2004, which is hereby incorporated by reference for all purposes.

FIELD OF THE INVENTION

The present invention relates to mixers, and more specifically to a quadrature mixer where the impedance presented to a signal input is high for signals at a desired signal frequency and low at undesired frequencies.

BACKGROUND

Design of typical radio-frequency (RF) receivers in cellular mobile terminals are subject to several design constraints. The first constraint is limitations on the ability to reliably detect very weak signals in the desired frequency channel. The second constraint is the ability to detect only slightly stronger in-band signals in the presence of very strong interfering signals. For instance, for the GSM system, the receiver must be able to reliably detect signals with a strength of −108 dBm in the absence of interference and a strength of −99 dBm while in the presence of 0 dBm interfering signals at an offset of 20 MHz or more.

The most common solution to solving problems caused by very strong interfering signals has been to make use of very high quality factor (Q) bandpass filters at the input of the receiver. These filters are typically surface acoustic wave (SAW) filters which pass the receive band with a typical attenuation of ~2.5 dB and attenuate out-of-band signals (e.g., 10-20 MHz away from the receive band) by about 20 dB. These filters are highly linear and typically result in a reduction of out-of-band interfering signals to about the same level as in band interference (−23 dBm).

There are several drawbacks associated with this approach however. The first is that in-band attenuation tends to make it harder to detect weak signals, creating the need for an even more sensitive receiver after the filter. More importantly, there is currently no economical way to implement SAW filters or their equivalents in the same processes as the active circuits that follow them, which are typically produced using CMOS or BiCMOS processes and either silicon or silicon germanium technologies. The result is that SAW filters significantly increase the cost and consume equally valuable circuit board area in a typical handset. This problem is further exacerbated by the proliferation of different frequency bands that a mobile handset has to be compatible with.

FIG. 1 is a diagram of an exemplary prior art system 100 for providing multiple band compatibility. Since each band has a different pass-band and different stop-bands, each band requires a separate SAW filter 102A, and, consequently separate input ports to the separate receiver inputs 104A as well as separate outputs from any transmit/receive (T/R) switch 106A or similar device.

FIG. 2 is a diagram of a linear-time-varying (LTV) low-pass filter 200 in accordance with the prior art. Filter 200 can be built by combining three capacitors and two switches, such as might be used in the separate and traditionally unrelated area of switched capacitor filters. A differential current of frequency $F_{SW}$ can be driven across ports $V_{0+}$ and $V_{0-}$. The bandwidth of the resulting filter is equal to $(C_i/C_0) \cdot F_{SW}$. Applying a current signal to $V_i$ at a frequency $F_{SW}+dF$, where dF is an offset frequency, results in a differential output voltage ($V_{0+}-V_{0-}$) with a frequency dF and a filtered amplitude with bandwidth $(Ci/Co) \cdot F_{SW}$. The input voltage $V_i$ is partially filtered by an LTV band-pass filter centered on $F_{SW}$ with a bandwidth of $2 \cdot (C_i/C_0) \cdot F_{SW}$.

SUMMARY OF THE INVENTION

In accordance with the present invention, a quadrature mixer is provided that overcomes known problems with quadrature mixers.

In particular, a quadrature mixer is provided that provides a high impedance at the signal input if the signal is a predetermined signal frequency, and a low impedance at other frequencies.

In accordance with an exemplary embodiment of the present invention, a quadrature mixer with a local oscillator (LO) input is provided. The quadrature mixer receives a signal having a frequency $F_{LO}$ and a signal input having a frequency $F_{SIG}$, and has an output that comprises an output impedance that is high at frequencies of $|F_{LO}-F_{SIG}|$ and $|F_{LO}+F_{SIG}|$ and low at other. A mixer coupled to the output impedance interacts with the output impedance such that an impedance presented at the signal input is high for signals at $F_{SIG}$ if $F_{SIG}$ is a predetermined signal frequency, and low at other frequencies.

The present invention provides many important technical advantages. One important technical advantage of the present invention is its ability to increase the wide-band linearity of an otherwise standard radio receiver. This in turn permits implementations without external high-Q filters, significantly reducing cost.

Those skilled in the art will further appreciate the advantages and superior features of the invention together with other important aspects thereof on reading the detailed description that follows in conjunction with the drawings.

BRIEF DESCRIPTION OF THE DRAWINGS

FIG. 1 is a diagram of an exemplary prior art system for providing multiple band compatibility;

FIG. 2 is a diagram of a linear-time-varying (LTV) low-pass filter in accordance with the prior art;

FIG. 4 is a diagram of a system for high-performance applications that use an additional input LC resonator, in accordance with an exemplary embodiment of the present invention;

FIGS. 5A through 5C are charts 500, 502 and 504 demonstrating how linearity can be degraded as a consequence of the time-varying input resistance of a MOSFET-based passive mixer;

FIG. 8 is a diagram of a system in accordance with an exemplary embodiment of the present invention;

FIG. 9 is a diagram of switch resistance as a consequence of input signal;

FIG. 13 is a diagram of a circuit for performing a balun function while simultaneously performing impedance matching to the LNA input in accordance with an exemplary embodiment of the present invention.

DETAILED DESCRIPTION OF PREFERRED EMBODIMENTS

Figure 3A:
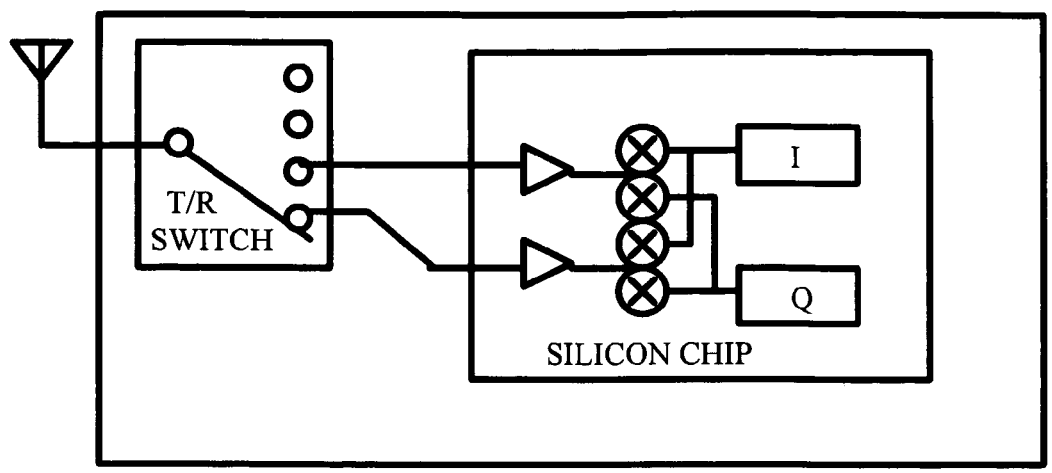
FIG. 3A is a diagram of an exemplary system for providing quadrature band GSM compatibility using the invention described herein.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

In one exemplary embodiment, the present invention permits detection of weak in-band signals in the presence of very strong out-of-band interference on a CMOS integrated circuit without the need for external high-Q filtering, such as may conventionally be achieved using SAW filters. These circuits can also be combined with a suitable LO to permit multiband operation, such as full quad-band GSM/DCS/PCS operation. In addition, the relatively wide bandwidth of the input combined with the elimination of the conventional requirement for external filters allows a reduction of the number of inputs required for the receiver in addition to a similar reduction in the required outputs from a T/R switch. For example, in a GSM/DCS/PCS handset, two taps could be used instead of the conventional requirement for three.

In another exemplary embodiment, the front-end of the receiver can be implemented without a SAW filter or other similar components by connecting a low noise amplifier (LNA) and a passive mixer. As used herein, a connection can include a direct connection, a connection through one or more intervening components, or other suitable connections. This configuration down-converts weak RF signals in the presence of strong out-of-band blocking signals. The LNA can include a highly linear transconductor or other suitable components that allow the current signal delivered to the LNA load to be provided with acceptably low distortion from any transconductance nonlinearities. The output of the LNA is connected to the input of the mixer so as to use the mixer's time varying properties to down convert the received signal to a low-intermediate frequency (IF) or baseband signal. Additionally, the input of the mixer acts as part of the LNA's load network. This connection allows the input impedance of the mixer, which acts a bandpass filter due to the time varying properties of the mixer, to filter the output voltage of the LNA. This filtering action reduces the amplitude of the unwanted interference signals as well as increases the linearity of the LNA by reducing the voltage levels caused by interference signals which might otherwise drive the LNA into a nonlinear mode of operation, which can also result in intermodulation and/or gain reduction of the desired receive signal.

In another exemplary embodiment, the LNA can be a pseudo-differential, heavily degenerated common source amplifier with a single-ended-to-differential converting matching network. Alternatively, a single-ended LNA, a fully differential LNA, or other suitable LNA circuits may be used. The LNA load network can include a parallel inductor/capacitor (LC) network connected in parallel with the passive mixer input. An RF choke in parallel with the mixer input, a transformer connected between the LNA and the mixer input, or other suitable load networks can also or alternatively be used.

The passive mixer can be any suitable mixer that provides a predetermined bandpass response to a signal provided to its input port. In one implementation, the mixer can include two double balanced passive mixers driven by quadrature LO signals. A suitable technique is used to ensure high linearity and reliability in the mixer switches. For example, the mixer output load can include one or several large capacitors which act to set the effective bandwidth of the mixer. This bandwidth affects not only the output low-pass bandwidth of the mixer, but sets the bandwidth of a band-pass-like response that appears at the input of the mixer, centered close to the LO or reference frequency. The resulting band-pass characteristic attenuates interfering signals that are separated by a large frequency difference so as to not overload the mixer and subsequent circuitry, as well as to help ensure that such interfering signals do not overload the output of the LNA.

The linearity, gain and noise figures can also be further improved by the use of LC tanks placed in series with the output(s), such as where the LC tanks are tuned to approximately twice the LO frequency.

FIG. 3A is a diagram of an exemplary system 300A for providing quad-band GSM compatibility without filters by using a mixer 105B described here.

Figure 3B:
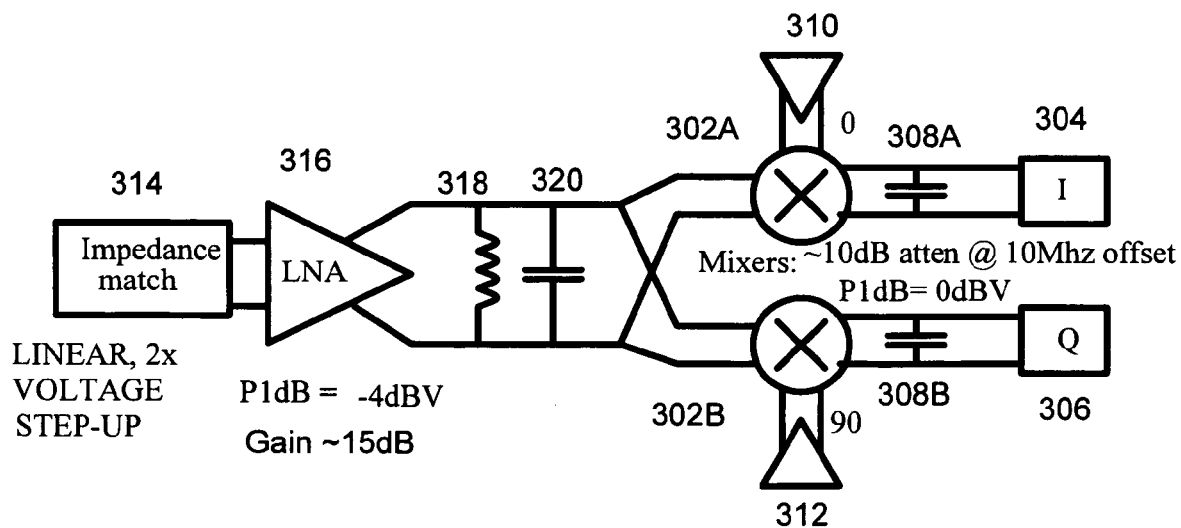
FIG. 3B is a diagram of a system that uses frequency selectivity in accordance with an exemplary embodiment of the present invention.

FIG. 3B is a diagram of a system 300B that uses frequency selectivity in accordance with an exemplary embodiment of the present invention. System 300B avoids the need for low-Q LC resonator-based filters, such as those that are typically used to achieve an LNA input match, and this frequency selectivity is instead postponed until after the LNA stage. In order to accomplish this, the LNA input should be more linear than a conventional receiver, e.g. about 20 dB more linear than in a conventional GSM receiver. In one exemplary embodiment, the linearity can be improved partly by increasing the noise figure, as the noise figure is no longer degraded by the in-band attenuation of the input SAW filter. The output linearity of the LNA, however, can present a much greater challenge to signal processing as any already strong blocking signal from the input would have been amplified by typically between 10 dB and 20 dB. For example, a 0 dBm signal on the input would result in approximately +15 dBm at the output, or about a 4 volt peak swing (for a typical on-chip impedance of 200Ω), which is a prohibitively large swing for a linear RF integrated circuit. This problem can be overcome by presenting the LNA output with a high-Q band-select output impedance, centered on the wanted frequency and with a sufficiently narrow bandwidth so that high-power interferes outside of this bandwidth will be attenuated to voltage levels where the LNA output is sufficiently linear.

Received signals pass first through impedance match 314, stepping up voltage swing while decreasing current swing to better drive the LNA 316. This LNA amplifies the signal from the impedance match and drives it, in current mode onto a load consisting of an LC tank made up of capacitor 318 and inductor 320 in parallel with two passive mixers 302A and 302B. These passive mixers are switched by local oscillator signals; mixer 302A is switched by signal from buffer 310, at 0 degrees phase, and mixer 302B is switched by signal from buffer 312, at 90 degrees phase. Each mixer 302A and 302B is loaded by a large capacitor (308A and 308B respectively) and then drives a baseband chain of additional processing (304 and 306 respectively).

The high-Q impedance is provided by the time varying behavior of the passive mixers 302A and 302B that follows the LNA. As discussed below, passive switching mixers 302A and 302B can act to convolve the frequency response of its output impedance with its LO frequency or switching frequency to provide a tuned high-Q filter centered on the switching frequency. The resulting time varying input impedance of the mixers 302A and 302B, in combination with any other loading circuitry sets the output load of the LNA and thus sets its gain. Since this impedance takes the form of a narrow-band peak, signals out of this band will tend to be attenuated at the LNA output relative to in-band signals resulting in reduced linearity requirements for the LNA output and subsequent circuitry.

Concurrent with this filtering action, the mixer acts to down-convert its input to low-pass filtered baseband or low-IF signal(s). In one exemplary embodiment, the mixer can be configured to produce in-phase output 304 and quadrature output 306 signals. In another embodiment, high-voltage-swing LO signals are used to drive the mixer so that the switches operate in a highly linear mode. This high voltage LO implementation, in turn, requires specialized high-swing drivers and mixer biasing techniques to guarantee reliability under high swing.

One property of passive mixers such as switching mixers 302A and 302B is that they are bi-directional and so tend to generate a time-varying interaction between their input and output impedances. Similar to the switched-capacitor effect described above, this means that large capacitors 308A and 308B placed on the output of passive mixers 302A and 302B interact with the mixer to form an output low-pass filter which convolves in the frequency domain with the LO to form an input band-pass impedance response centered on or close to the switching frequency.

FIG. 4 is a diagram of a system 400 for high-performance applications that use an additional input LC resonator, in accordance with an exemplary embodiment of the present invention. System 400 provides additional filtering as well as keeping the capacitance connected to the input from detuning the response. As in the case for the simple capacitive loading, this circuit provides a high-Q input band-pass impedance.

The benefit, as discussed in previous sections, is that the band-pass form of the input impedance can be used to attenuate out-of-band current mode signals before they are translated into voltages, thereby increasing the out-of-band signal strength which can be applied at the input of the LNA before driving the circuitry into nonlinearity. Unfortunately, simple switched capacitive structures, even in differential implementations such as shown in FIG. 4, are poorly suited to high-performance applications such as cellular handsets. These problems primarily involve mixer linearity and the generation of quadrature outputs as is typically required.

Inductor 402 and capacitor 404 form a parallel resonant tank, with a peak impedance at or near the desired receive frequency. This tank is in parallel with the passive mixer, made up of switches 406, 408, 410 and 412. At any given time either switches 408 and 412 are closed, or switches 406 and 410 are closed, connecting the tank across Co in alternating polarities every half cycle of VSW.

Figure 5B:
Figure 5C:

FIGS. 5A through 5C are charts 500, 502 and 504 demonstrating how linearity can be degraded as a consequence of the time-varying input resistance of a MOSFET-based passive mixer. The consequence is that the effective average impedance seen by an input signal near the LO frequency will depend on the phase relationship between LO and RF, as depicted in FIG. 5B and FIG. 5C. For an RF frequency $F_{RF}$ which is different from the LO frequency $F_{LO}$ by an offset dF such that $F_{RF}=F_{LO}+dF$, this results in amplitude modulation on the RF signal at frequency dF, potentially leading to second-order nonlinearity effects and effectively reducing the desired blocker attenuation. Additionally, nonlinearity can occur when using FET switching devices in the mixer if a significant drain-source voltage $V_{ds}$ appears across the switching devices. Due to a number of physical effects in FET transistors, such as channel pinch off near the drain region and velocity saturation for short channel devices, the resistance of a FET switch is typically a function of the channel voltage, resulting in a nonlinearity between the switch voltage and current. This nonlinearity can be reduced by keeping the $V_{ds}$ of the device as low as possible, since the resistance becomes more linear as the $V_{ds}$ amplitude approaches zero. This problem can be partially solved by making the nominal $R_{ch}$ low, but additional methods to reduce $V_{ds}$ could also or alternatively be used.

Figure 6:
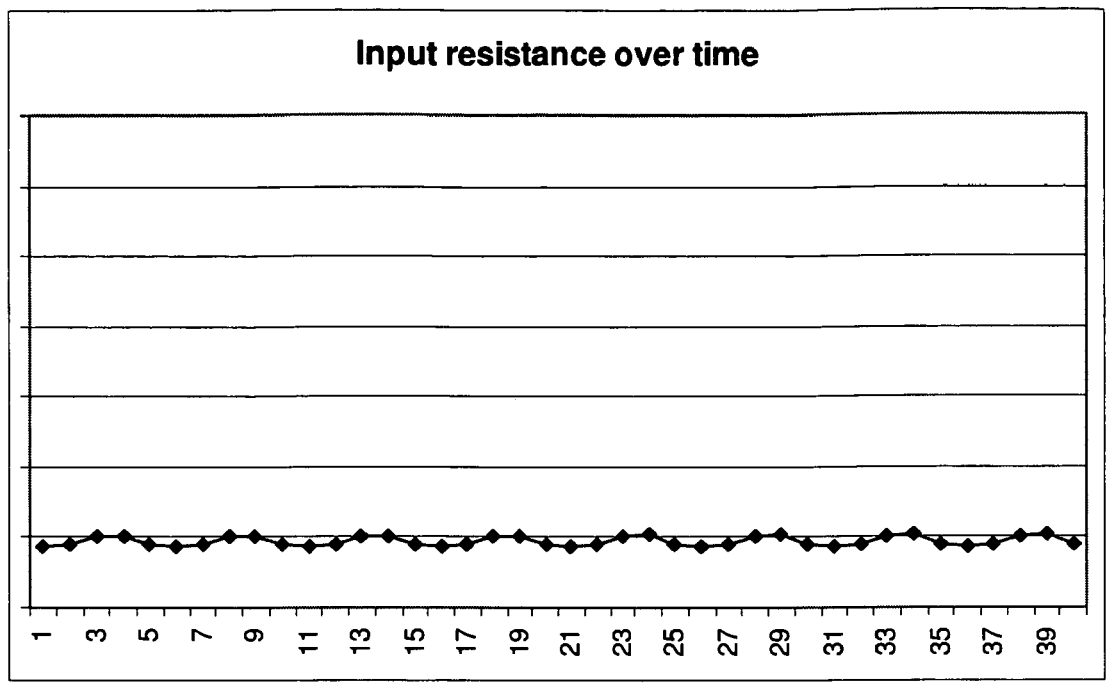
FIG. 6 is a chart of the phase dependent resistance that results from a representative I/Q mixer with inputs connected together, in accordance with an exemplary embodiment of the present invention.

FIG. 6 is a chart 600 of the phase dependent resistance that results from a representative I/Q mixer with inputs connected together, in accordance with an exemplary embodiment of the present invention. In the case where in-phase (I) and quadrature (Q) signals are required, the mixer section can consist of two mixers driven by in-phase and quadrature LO signals, respectively. In conventional implementations, some isolation between the two mixing cores is typically desired to avoid interaction between the mixing actions of the two mixers. In this case, however, several benefits are obtained by tying the RF inputs of the I and Q mixers together. The first benefit is simplicity, which results in lower power consumption since all active input circuits (e.g., the LNA) can be shared. The second effect is that since the I and Q mixers are 90 degrees out of phase, the second harmonic component of the time varying input resistance of the two mixers tend to cancel one another, which removes the phase-dependant resistance described above, and thereby reduces inadvertent sideband generation.

Figure 7:
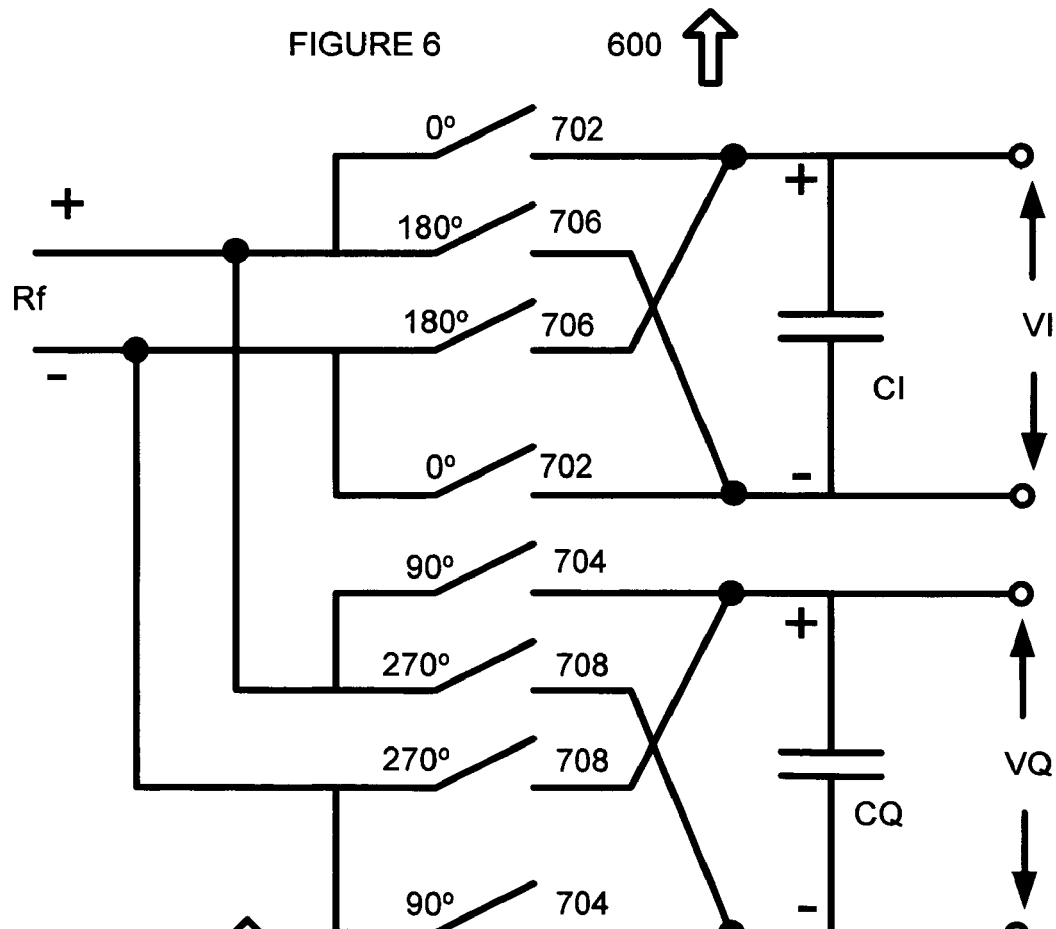
FIG. 7 is a diagram of a system in accordance with an exemplary embodiment of the present invention.

FIG. 7 is a diagram of a system 700 in accordance with an exemplary embodiment of the present invention. For the first quarter cycle of the LO, switches 702 and 708 are on. Then, for the second quarter of the cycle of the LO, switches 702 and 704 are on. For the third quarter of the cycle for the LO, switches 704 and 708 are, and for the last quarter of a cycle of the LO, switches 706 and 708 are on. One drawback of this configuration is that at any given moment, the outputs of the I and Q mixers are shorted together. Since the exact configuration of what is shorted changes every quarter of an LO cycle, charge sharing between the output capacitors can generate a rapid leakage path. For example, in the first quarter cycle, CI+ is shorted to CQ− and CI− to CQ+, so each pair has equal voltage, and in the second quarter cycle CI+ is shorted to CQ+ and CI− to CQ−. In order for this change to occur, a charge of (VI/2)·CQ must be transferred from CI+ to CI−, which would require a rapid discharge of the output capacitors, a severe reduction in low frequency gain and a massive broadening of the effective bandwidth, all of which are unacceptable. Hence, in the process of overcoming the problems of phase-dependant impedance and quadrature down-conversion, a new problem that has not been previously identified and which must be addressed is introduced: leakage between I and Q.

An alternative way of describing the leakage problem is to notice that this leakage occurs at the frequency $2 \cdot F_{LO}$. One can view the impedance seen at the input of the mixer $Zi(\omega_{RF})$ as the parallel combination $Z_o(\omega_{LO}-\omega_{RF}) || Z_o(\omega_{LO}+\omega_{RF})$, where $Z_o(\omega)$ is the impedance seen by the output of the mixer at frequency $\omega$. Placing large capacitors on the outputs of the mixer means that $Z_o(\omega_{LO}-\omega_{RF}) \rightarrow \infty$ as $\omega_{RF} \rightarrow \omega_{LO}$, but results in a very low impedance for $Z_o(\omega_{LO}+\omega_{RF})$. The low impedance, high frequency term tends to shunt the high-impedance low frequency term, which reduces gain and increases bandwidth. This effect does not appear for typical single phase (non-quadrature) cases because the second-harmonic shunting effect only acts when the instantaneous phase between RF and the LO approaches 90 degrees, and so acts primarily when the down-converted signal is passing through zero anyway.

FIG. 8 is a diagram of a system 800 in accordance with an exemplary embodiment of the present invention. Operation of switches 802, 804, 806 and 808 occurs as previously described in regards to switches 702 through 708 of FIG. 7. By adding resonant parallel LC tanks 810, 812, 814 and 816 in series with the large output capacitors CI and CQ and tuning them to approximately $2 \cdot F_{LO}$, the impedance can be made to go high near both $F_{LO}-F_{RF}$ and $F_{LO}+F_{RF}$.

By using a value of $L \cdot Q \cdot (\omega_{LO}+\omega_{RF})$ for small values of $|\omega_{LO}-\omega_{RF}|$ and $1/(C_L \cdot |\omega_{LO}-\omega_{RF}|)$ for larger values, the resonant tanks can be used to recover the frequency selectivity of the mixer while permitting quadrature down-conversion. A second benefit of adding these tanks is that they permit the drains of the switches that are on to track their sources in an RF sense (while still tracking the output capacitance in a low frequency sense), such that the result is a reduction in signal-dependant $V_{ds}$, and thus increased linearity.

Figure 11A:
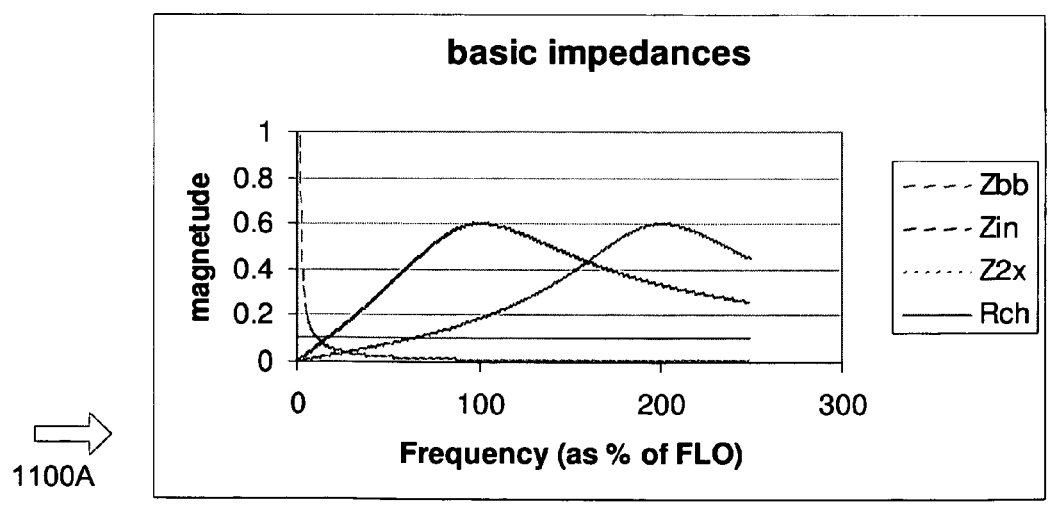
FIGS. 11A through 11C are charts showing circuit parameters in accordance with an exemplary embodiment of the present invention.
Figure 11B:
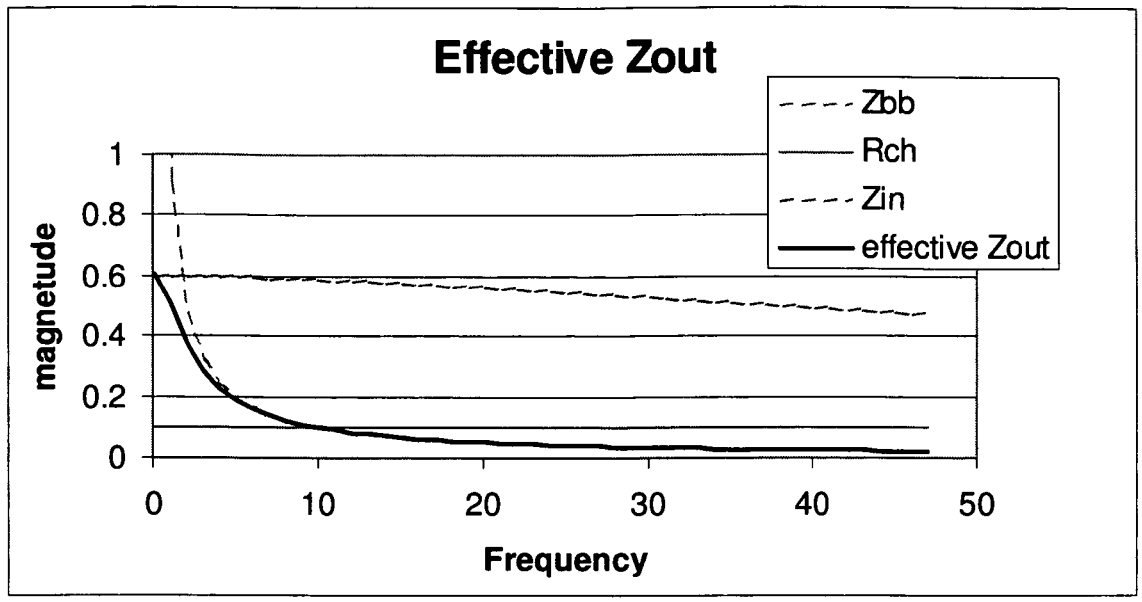
Figure 11C:
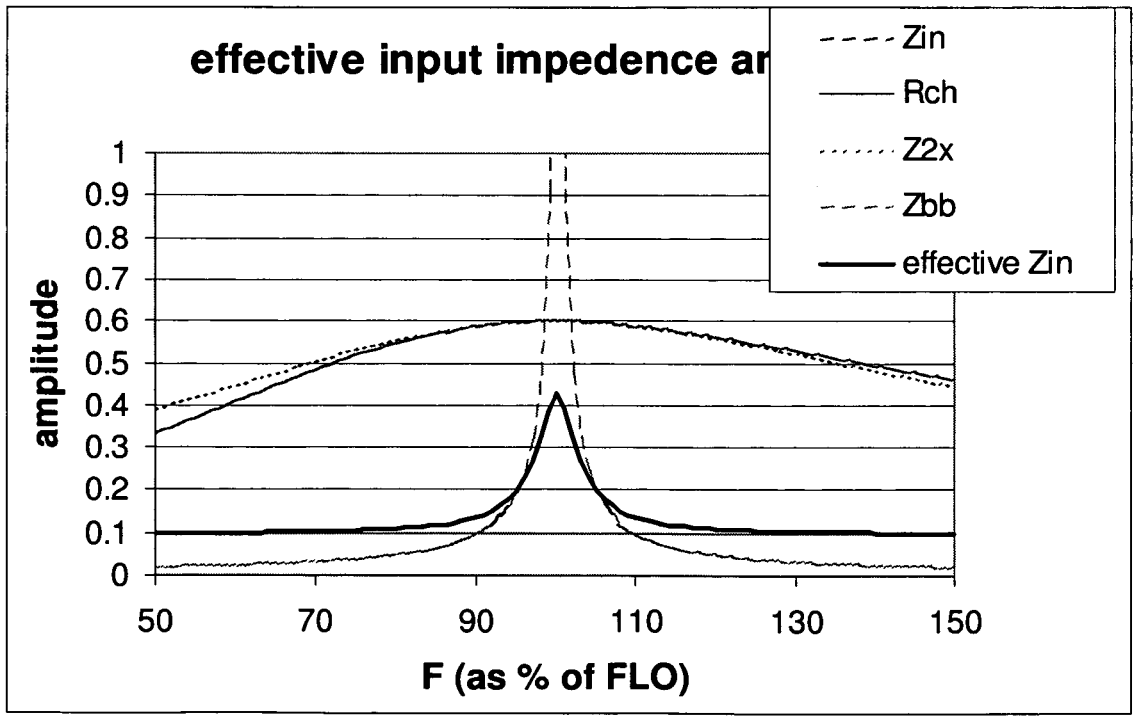

FIGS. 11A through 11C are charts 1100A through 1100C showing circuit parameters in accordance with the exemplary embodiment of the present invention as shown in FIG. 8. Chart 1100A shows an exemplary diagram of relevant impedances of a mixer where $Z_{bb}=1/sCo$, Zin, $Z_{2LO}$ are tuned RLCs.

FIG. 11B shows an exemplary chart 1100B of output impedance as a function of a combination of Zbb, Zin and Rch. These are the impedances of 1100A but with Zin translated by $F_{LO}$ to be centered on baseband. This figure demonstrates the effect of Zin on effective Zout.

FIG. 11C shows an exemplary chart 1100C of input impedance based on a combination of Zin, Rch, frequency-shifted Zbb and $Z_{2LO}$. This chart demonstrates how interactions between Zin and the translated $Z_{2LO}$ set the maximum effective Zin. Furthermore it demonstrates how these impedances interact with the translated $Z_{bb}$ sets intput bandwidth. Finally this chart shows how $R_{ch}$ limits wideband attenuation of the effective Zin.

In implementations using FET devices such as MOSFETs, the point when a switch turns on as well as its conductance during the on-state both depend upon not just the LO-driven gate voltage, but also the input source voltage and output drain voltage. One consequence is that strong input signals can modulate the switching point of a transistor, as shown in the effective mixing waveform of FIG. 9. A second effect is that strong input signals can modulate gds and thus Ron of the switches, which in turn changes the degree of blocker signal attenuation. Both of these effects result in nonlinearity in the mixer, degrading performance.

FIG. 9 is a graph 900 showing the effect of source (input) voltage on resistance of a given switch. Since peak resistance 901 relates to the attenuation of out-of band signals, changes in resistance due to large signals imply second-order nonlinearity effecting large out of band signals, which is highly undesirable. Furthermore, it can be seen that changes in Vs change the turn-on-time of the switch 902. Such modulation of timing affects the properties of the mixer in ways that affect both wanted and unwanted signals.

Figure 10:
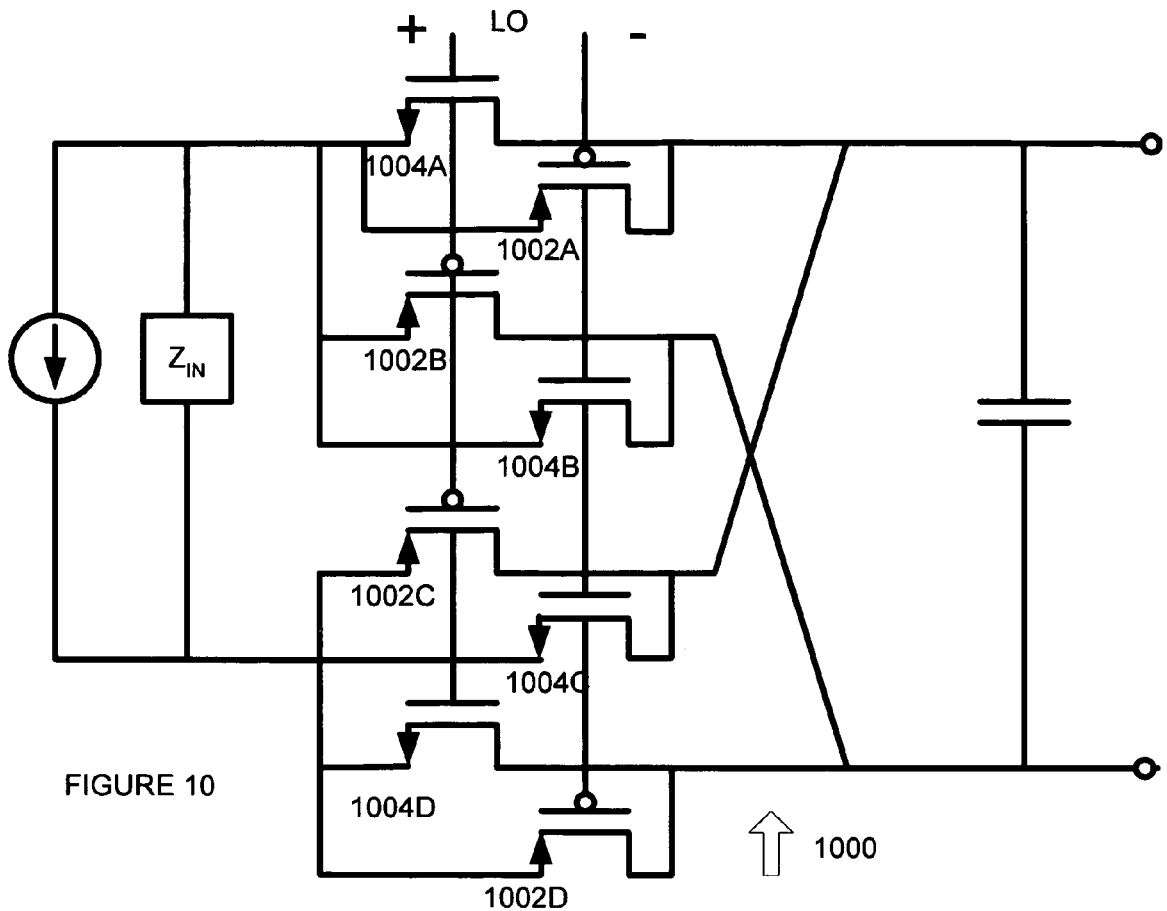
FIG. 10 is a diagram of complementary CMOS switches for improving mixer linearity in accordance with an exemplary embodiment of the present invention.

FIG. 10 is a diagram of complementary CMOS switches 1000 for improving mixer linearity in accordance with an exemplary embodiment of the present invention. The configuration of complementary CMOS switches 1000 allows the PMOS switches 1002A through 1002D to respond to changes in source voltage Vs in the complementary way to the NMOS switches 1004A through 1004D, such that to first order, changes in transistor conductance due to large signals on the RF input will cancel and lead to a conductance which tends to be relatively independent of source and drain voltages, improving linearity. Similarly, changes in the effective transition points of the individual switching transistors will have opposite polarity and so their effects tend to cancel to first order. Although using complimentary switches increases the parasitic capacitance of the mixer on all of its ports, it does not necessarily require extra circuitry to drive. In a differential mixer, complimentary LO signals are typically required even without complementary switches to drive the two differential phases, and so the polarity of the NMOS and PMOS LO drives can simply be reversed. Typically, PMOS transistors should be scaled relative to NMOS such that they have equal conductances, i.e. equal values of $\mu \cdot C_{ox} \cdot W/L$.

An additional problem to be addressed is that the series resistance of the mixer switches, when on, must be relatively low, such as to avoid excessive noise generation in those switches and other problems. The series resistance of the switches also sets the limit on the amount out-of-band attenuation which is possible to achieve at the input of the mixer, where the inband-to-out-of-band attenuation ratio is approximately equal to the ratio between the impedance seen by the input of the mixer to the series resistance of the mixer switches, as shown in FIG. 11C. Using short channel length transistors, with as much total gate width as possible and with the largest possible gate drive voltage when on, can avoid these problems.

High gate drive swing is desirable to minimize the series resistance of the mixer switches. In addition, increased swing can improve the effective linearity of the mixer by reducing the ratio between the RF and LO voltages, $V_{RF}/V_{LO}$, which is approximately equal to the ratio between the difference in source voltage induced by the rd and the dc gate-source voltage imposed by the LO, $dV_s/V_{gs}$. This ratio is roughly proportional to the effect that RF signals have on the conductance of the mixer switches, and so directly relates to linearity. Likewise, since higher swing implies faster transitions, higher swing implies that changes in Vs have less effect on transition times, also relating to linearity. Ideally it would be possible to drive $V_{gs}$ as high as is possible, which for CMOS devices is close to the oxide break-down voltage $V_{box}$. Since the LO drive signal will typically be approximately sinusoidal and so have equal maximum and minimum deviations from its bias point, any bias voltage difference between the gates (LO inputs) and other ports (the source, drain, and bulk) will add to this voltage difference and so decrease the maximum possible swing possible without breaking the transistor down. Thus it is usually beneficial to provide that the gate, drain, source and bulk take on the same voltage. In processes that allow both N-type and P-type transistors to be dc isolated from the bulk, such as triple-well or silicon-on-insulator (SOI), this can be achieved by choosing a bias voltage (typically based upon the required output level) and tying the bulks directly to it, while tying the drains (baseband outputs) and gates to that voltage through large resistances, and then AC coupling in the RF and LO signals.

Figure 12:
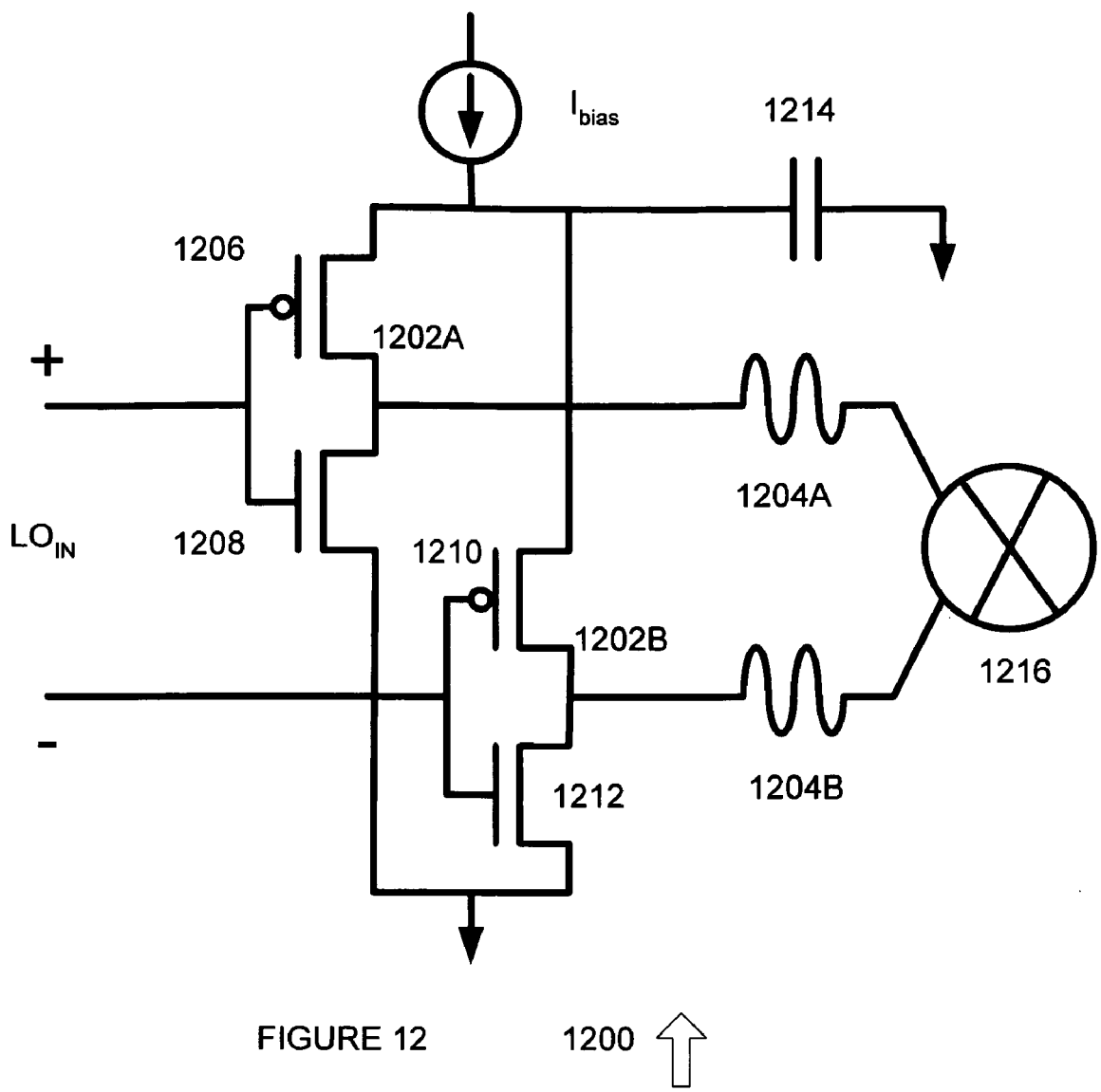
FIG. 12 is a diagram of an exemplary drive structure in accordance with an exemplary embodiment of the present invention.

FIG. 12 is a diagram of an exemplary drive structure 1200 in accordance with an exemplary embodiment of the present invention.

One difficulty in achieving large LO voltage swing (e.g., LO swing=$2 \cdot V_{box}$) is that the LO drive circuit must produce this signal. A purely active approach would face the problem that any output device will inherently see this large voltage swing (e.g., $2 \cdot V_{box}$), and will be prone to break down. If the mixer is implemented with FET devices with the gates driven by the LO, the LO input impedance is largely capacitive.

The LO buffer consists of a pair of CMOS inverters 1202A and 1202B, driven differentially and each consisting of NMOS transistors 1206 and 1210 and PMOS transistors 1208 1212. The outputs of the inverters 1202A and 1202B drive the mixer 1216 differentially through two inductors 1204A and 1204B respectively. These inductors resonate with any input capacitance to generate increased voltage swing. The amplitude of this swing is set by the available charge for each half-cycle of the buffer. Charge is stored on capacitor 1214, which is continuously charged by Ibias and discharged alternately by inverters 1202A and 1202B.

Complementary push-pull drivers 1202A and 1202B can be used to achieve reasonable efficiency, while an inductor 1204A and 1204B placed in series with the output with a value chosen to resonate with the LO input capacitance of the mixer permits a voltage step-up by a factor of approximately Q, where Q is the quality factor of the LCR resonator consisting of the inductor and the mixer input capacitance. By choosing a Q>2 the swing at the output of the driver can be kept less than the breakdown voltage while driving the desired peak-to-peak swing (e.g., approximately $2 \cdot V_{box}$). Optionally, an additional technique can be used to make the output swing independent of the resonant Q. By current limiting the push-pull stage, one can guarantee a peak-to peak swing of $I_{bias}/(C_{in} \cdot F_{LO})$ regardless of inductor Q (permitting the use of a higher Q inductor without worrying about overdriving the mixer. Note that Q must be at least 2 to allow a peak-to-peak mixer drive of $V_{box}$ without presenting the driver with more than $V_{box}$.

FIG. 13 is a diagram of a circuit 1300 for performing a balun function while simultaneously performing impedance matching to the LNA input in accordance with an exemplary embodiment of the present invention.

Circuit 1300 includes a matching circuit 1302 and a transaconductance 1304. The differential LNA and matching network of FIG. 13 works as follows. A pair of signals containing both differential and common-mode components is AC-coupled into the matching network through capacitors 1306 and 1308. Parallel resonance set up by the combined inductance of 1312 and 1314 and capacitances 1310, 1306 and 1308 act to increase voltage swing in the differential mode. a series resonance set up by inductors 1312 and 1314 and capacitor 1316 acts to suppress common mode voltage swing. This differential voltage signal is presented to the gates of transistors 1322 and 1324, which act as a psuedo-differential amplifier, and which are linearized by the degeneration presented by inductors 1318 and 1320. The current-mode signals for transistors 1322 and 1324 are then buffered by cascode transistors 1326 and 1328.

Achievable LNAs will typically be relatively broad-band, compared to possible in-band interfering frequency separation and so must be sufficiently linear to handle the maximum blocking signal strength without unacceptable degradation in amplification of weak wanted signals. This condition imposes two requirements for the LNA design. The first is that the LNA should have a very high input compression point; the second is that the LNA should have a high degree of rejection for even-order nonlinearities, as these tend to cause misoperation in low-IF and direct conversion receivers. When using a common-source style amplifier, high input compression implies a large amount of source degeneration. For reasons of noise and input matching, a relatively large inductance in series with the source combined with a relatively high bias current is preferable. Specifically, $I_{bias} \cdot L \cdot \omega > V_{swing}$, where $I_{bias}$ is the bias current, L is the source inductor, and $\omega$ is the operating frequency. For suppression of even-order nonlinearities, one approach is to use a differential LNA. This helps reduce nonlinearity both in the LNA itself and, if the following mixer is also differential, the even order linearity of the mixer which it drives. If the input signal must be single-ended, as is commonly the case, some sort of single-ended to differential conversion is needed.

Although exemplary embodiments of a system and method of the present invention have been described in detail herein, those skilled in the art will also recognize that various substitutions and modifications can be made to the systems and methods without departing from the scope and spirit of the appended claims.

What is claimed is:

1. A receiver circuit comprising:
   a quadrature passive mixer having an input and an output;
   one or more output impedances coupled to the output of the quadrature passive mixer wherein an input impedance of the quadrature passive mixer provides a band-pass response;
   a low noise amplifier (LNA) having an input and an output coupled to the quadrature passive mixer, the LNA configured to provide substantially linear transconductance over a predetermined input range; and
   wherein the LNA and the quadrature passive mixer are configured so that a band-pass mixer input impedance response is presented to the output of the LNA so as to substantially reduce a LNA voltage gain for unwanted signals presented to the LNA input.

2. The receiver of claim 1, wherein the LNA is a common source amplifier and includes source degeneration.

3. The receiver of claim 2, wherein:
   LO inputs of one or more switches of the quadrature passive mixer are driven by buffers through series-resonant LC structures;
   the series-resonant LC structures are tuned to an LO frequency; and
   a peak-to-peak swing at the switches is enhanced beyond a breakdown voltage of the buffer.

4. The receiver of claim 1, wherein the LNA is a differential amplifier.

5. The receiver of claim 1, wherein:
   a frequency of operation corresponds to a channel in a wireless voice communications band;
   the linear transconductance of the LNA input reduces degradation of an in-band signal in the presence of an out-of band signal; and
   the band-pass response of the mixer attenuates the out-of band signal so as to prevent the out-of-band signal from degrading the in-band signal at the output of the LNA.

6. The receiver of claim 5, wherein the receiver is selected from one or more of the group comprising a low intermediate frequency receiver and a direct conversion receiver.

7. The receiver of claim 5, wherein:
   the in-band signal corresponds to a channel in a GSM band;
   the LNA input is sufficiently linear so as to not significantly degrade sensitivity-level wanted signals in the presence of out-of band signals;

the band-pass action of the mixer attenuates out-of-band signals to prevent out-of-band signals from degrading wanted signals at the output of the LNA.

8. The receiver of claim 1, wherein the quadrature passive mixer further comprises:

a plurality of NFETs and PFETs; and wherein the NFETs and PFETs are driven with substantially differential signals.

9. The receiver of claim 1, wherein the quadrature passive mixer further comprises:

a plurality of FET switches; and wherein two or more of the FET switches are biased to approximately a same voltage.

10. The receiver of claim 1, wherein the quadrature passive mixer further comprises:

a plurality of FET switches; and wherein two or more of the FET switches are biased to approximately the same voltage.

11. A receiver circuit comprising:

a mixer having an input and an output;

one or more output impedances coupled to the output of the mixer wherein an input impedance of the mixer provides a band-pass response; and a low noise amplifier (LNA) having an input and an output coupled to the mixer, the LNA configured to provide substantially linear transconductance over a predetermined input range.

12. The receiver of claim 11, wherein the linear transconductance of the LNA input reduces degradation of an in-band signal in the presence of an out-of band signal.

13. The receiver of claim 11, wherein the mixer further comprises:

a plurality of NFETs and PFETs; and wherein the NFETs and PFETs are driven with substantially differential signals.

14. A receiver circuit comprising:

a quadrature passive mixer having an input and an output;

means coupled to the output of the quadrature passive mixer for providing a band-pass response of an input impedance of the quadrature passive mixer; and a low noise amplifier (LNA) having an input and an output coupled to the quadrature passive mixer, the LNA configured to provide substantially linear transconductance over a predetermined input range.

15. The receiver of claim 14, wherein the LNA and the quadrature passive mixer are configured so that a band-pass mixer input impedance response is presented to the output of the LNA so as to substantially reduce a LNA voltage gain for unwanted signals presented to the LNA input.

16. The receiver of claim 14, wherein:

a frequency of operation corresponds to a channel in a wireless voice communications band;

the linear transconductance of the LNA input reduces degradation of an in-band signal in the presence of an out-of band signal.

17. A receiver circuit comprising:

a mixer having an input and an output;

one or more output impedances coupled to the output of the mixer providing an input impedance of the mixer with a band-pass response;

a low noise amplifier (LNA) having an input and an output and providing substantially linear transconductance over a predetermined input range coupled to the mixer; and wherein a band-pass mixer input impedance response is presented to the output of the LNA.

18. The receiver of claim 17, wherein the quadrature passive mixer further comprises:

a plurality of NFETs and PFETs; and wherein the NFETs and PFETs are driven with substantially differential signals.

19. The receiver of claim 17, wherein the quadrature passive mixer further comprises:

a plurality of FET switches; and wherein two or more of the FET switches are biased to approximately the same voltage.

20. A receiver comprising:

a quadrature passive mixer having an input and an output and an input impedance and providing a band-pass response;

a low noise amplifier (LNA) having an input and an output coupled to the quadrature passive mixer, the LNA configured to provide substantially linear transconductance over a predetermined input range; and wherein the LNA and the quadrature passive mixer are configured so that a band-pass mixer input impedance response is presented to the output of the LNA so as to substantially reduce a LNA voltage gain for unwanted signals presented to the LNA input.

21. The receiver of claim 20, wherein:

a frequency of operation corresponds to a channel in a wireless voice communications band;

the linear transconductance of the LNA input reduces degradation of an in-band signal in the presence of an out-of band signal; and the band-pass response of the mixer attenuates the out-of band signal so as to prevent the out-of-band signal from degrading the in-band signal at the output of the LNA.

* * * * *